(12) United States Patent
Aoki et al.

(10) Patent No.: US 7,728,467 B2
(45) Date of Patent: Jun. 1, 2010

(54) HEAT GENERATING MEMBER COOLING STRUCTURE AND DRIVE UNIT

(75) Inventors: Kazuo Aoki, Anjo (JP); Junji Tsuruoka, Anjo (JP); Seiji Yasui, Nagoya (JP); Yasushi Kabata, Sakai (JP); Hideyuki Miyahara, Okaya (JP); Masaharu Kumagai, Okaya (JP)

(73) Assignees: Aisin AW Co., Ltd., Anjo (JP); Nakamura Mfg. Co., Ltd., Okaya (JP)

( * ) Notice: Subject to any disclaimer, the term of this patent is extended or adjusted under 35 U.S.C. 154(b) by 0 days.

(21) Appl. No.: 12/010,168

(22) Filed: Jan. 22, 2008

(65) Prior Publication Data

US 2008/0179972 A1 Jul. 31, 2008

(30) Foreign Application Priority Data

Jan. 26, 2007 (JP) ............................. 2007-016279

(51) Int. Cl.
*H02K 9/00* (2006.01)
*H02K 9/06* (2006.01)

(52) U.S. Cl. .......................................... 310/54; 310/64
(58) Field of Classification Search .................. 310/54, 310/64
See application file for complete search history.

(56) References Cited

U.S. PATENT DOCUMENTS 4,660,630 A * 4/1987 Cunningham et al. ....... 165/133
5,056,586 A * 10/1991 Bemisderfer ............. 165/109.1
7,102,260 B2 * 9/2006 Takenaka et al. .............. 310/64
7,117,928 B2 * 10/2006 Chen .......................... 165/80.3
2004/0040327 A1 * 3/2004 Iida et al. .................... 62/259.2
2005/0253465 A1 11/2005 Takenaka et al.
2007/0012431 A1 * 1/2007 Miyahara ..................... 165/170
2007/0163749 A1 * 7/2007 Miyahara ................... 165/80.3

FOREIGN PATENT DOCUMENTS

| JP | A 63-64347 | 3/1988 |
| JP | A 2-168697 | 6/1990 |
| JP | A 2002-110878 | 4/2002 |
| JP | A 2002-164487 | 6/2002 |
| JP | A-2005-142247 | 6/2005 |
| JP | A-2005-254417 | 9/2005 |
| JP | A-2006-100293 | 4/2006 |
| JP | A 2006-278735 | 10/2006 |
| WO | WO 2004/025807 A1 | 3/2004 |

* cited by examiner

*Primary Examiner*—Quyen Leung
*Assistant Examiner*—Jose A Gonzalez Quinones
(74) *Attorney, Agent, or Firm*—Oliff & Berridge, PLC (57) ABSTRACT

A heat generating member cooling structure in which a coolant space is formed between a heat releasing surface that is thermally connected to a heat generating member and an opposing surface that is positioned opposite the heat releasing surface, includes a plurality of heat releasing fins that are provided within the coolant space so as to be parallel to one another and stand from the heat releasing surface toward the opposing surface, and an inter-fin passage, through which a coolant flows, formed between every two of the plurality of heat releasing fins that are positioned adjacent to each other.

19 Claims, 6 Drawing Sheets

HEAT GENERATING MEMBER COOLING STRUCTURE AND DRIVE UNIT

INCORPORATION BY REFERENCE

The disclosure of Japanese Patent Application No. 2007-016279 filed on Jan. 26, 2007 including the specification, drawings and abstract is incorporated herein by reference in its entirety.

BACKGROUND

The present invention relates to a heat generating member cooling structure and a drive unit.

When an electric motor is used as a driving power source of a vehicle, the electric motor requires an inverter for controlling the electric motor and an ECU or the like for controlling the inverter. The inverter and the like are each connected to the electric motor via a power cable. Thus, it is possible to position these elements in appropriate places away from the electric motor. However, for the sake of convenience during the installation of theses elements into the vehicle, these elements may be arranged to be integrated with a drive unit that has the electric motor built therein.

The heat resistance temperature of the inverter and the like is currently lower than the heat resistance temperature of the electric motor. Thus, when the inverter and the like are positioned so as to be integrated with the drive unit that has the electric motor built therein, it is necessary to have an arrangement for blocking the heat that is directly transferred from the electric motor to the inverter and the like in order to thermally protect the inverter and the like. In addition, because the temperature of the inverter and the like increases due to their own heat generation, it is necessary to cool down the inverter and the like so that they are kept below their heat resistance temperatures.

To cope with this circumstance, a drive unit that has a cooling structure for cooling down an inverter as well as an electric motor has been proposed (for example, see International Publication No. WO 2004/025807). In the cooling structure included in the drive unit disclosed in International Publication No. WO 2004/025807, a coolant space is formed between a heat releasing surface that is thermally connected to an inverter and an opposing surface that is positioned opposite the heat releasing surface and is thermally connected to the drive unit case. A plurality of heat releasing fins are provided within the coolant space such that they are positioned parallel to one another and stand so as to protrude from the heat releasing surface on the inverter case side toward the case surface on the drive unit case side. An inter-fin passage through which the coolant flows is formed between every two of the plurality of heat releasing fins that are positioned adjacent to each other. In this type of cooling structure, the coolant that is supplied by a coolant pump into the coolant space flows through the plurality of inter-fin passages that are positioned parallel to one another. With this arrangement, it is possible to cool down the inverter via the heat releasing surface and also to cool down the electric motor via the opposing surface.

In conventional heat generating member cooling structures that are used for cooling down a heat generating member such as an inverter like the one described above, a configuration has been proposed in which heat releasing fins are formed to stand from a heat releasing surface by cutting and raising the heat releasing surface that is thermally connected to the heat generating member with the use of a cutting tool (for example, see Japanese Patent Application Publications No. JP-A-2005-142247 and No. JP-A-2005-254417).

In the conventional heat generating member cooling structures disclosed in Japanese Patent Application Publications No. JP-A-2005-142247 and No. JP-A-2005-254417, the plurality of heat releasing fins are formed so as to be positioned parallel to one another by cutting and raising, a number of times in succession, the heat releasing surface so that there is a small distance between the heat releasing fins. Thus, inter-fin passages, each of which has a small width, are formed so as to have a small distance there between. In this configuration, it is considered that the heat transfer area of the heat releasing fins is enlarged, and the level of heat releasing performance is improved.

Another heat generating member cooling structure has been proposed in which a plurality of heat releasing fins that stand from the heat releasing surface are positioned parallel to one another. An inter-fin passage through which coolant flows is formed between every two of the plurality of heat releasing fins that are positioned adjacent to each other. Further, each of the heat releasing fins is formed so as to have a meandering shape that has a plurality of bent portions along the direction in which the coolant flows (see, for example, Japanese Patent Application Publication No. JP-A-2006-100293).

In the heat generating member cooling structure disclosed in Japanese Patent Application Publication No. JP-A-2006-100293, by arranging the plurality of meandering-shaped heat releasing fins so as to be positioned parallel to one another, a meandering-shaped inter-fin passage having inflection portions that inflects the flowing direction of the coolant is formed between every two of the plurality of heat releasing fins that are positioned adjacent to each other. In this configuration, it is considered that the heat transfer area of the heat releasing fins is enlarged, and also the level of heat releasing performance is improved by inflecting the flowing direction of the coolant at the inflection portions of the inter-fin passages so that turbulence is promoted in the flow.

SUMMARY

With the heat generating member cooling structures used for cooling down heat generating members such as an inverter as described above, there is a demand that the level of heat releasing performance should be further improved because drive units have become more compact recently.

Especially, even if the coolant is arranged to flow in meandering-shaped inter-fin passages like in the heat generating member cooling structure disclosed in Japanese Patent Application Publication No. JP-A-2006-100293, the side wall surfaces on both sides of each of the heat releasing fins are formed to have the same shape as each other. Thus, the passage width of the inter-fin passages is regular in terms of the direction in which the heat releasing fins are positioned parallel to one another. As a result, it is not possible to allow the coolant flowing through the inter-fin passages to have enough turbulence. Consequently, the level of heat releasing performance is not improved high enough.

Also, in order to improve the level of heat releasing performance, one idea is to increase the amount of coolant that is supplied by a coolant pump to a coolant space. However, because a pressure loss in the coolant space is relatively large, a problem arises where the coolant pump needs to be large, and the energy loss is increased.

In view of the problems described above, a heat generating member cooling structure that has a high level of heat releasing performance is provided and a drive unit that includes such a heat generating member cooling structure and is therefore able to be compact and achieve energy-saving is realized.

In addition various other structures are provided and various other advantages can be achieved.

According to an exemplary aspect of the invention, a heat generating member cooling structure in which a coolant space is formed between a heat releasing surface that is thermally connected to a heat generating member and an opposing surface that is positioned opposite the heat releasing surface, includes a plurality of heat releasing fins that are provided within the coolant space so as to be parallel to one another and stand from the heat releasing surface toward the opposing surface, and an inter-fin passage, through which a coolant flows, formed between every two of the plurality of heat releasing fins that are positioned adjacent to each other. Each of the heat releasing fins is formed so as to have a meandering shape that has a plurality of bent portions along a direction in which the coolant flows, and side wall surfaces on both sides of each of the heat releasing fins are formed so as to have mutually different shapes.

BRIEF DESCRIPTION OF THE DRAWINGS

Various exemplary aspects of the invention will be described with reference to the drawings, wherein.

DETAILED DESCRIPTION OF THE PREFERRED EMBODIMENTS

Embodiments of a heat generating member cooling structure and a drive unit that includes the heat generating member cooling structure according to the present invention will be explained, with reference to the drawings.

Figure 2:
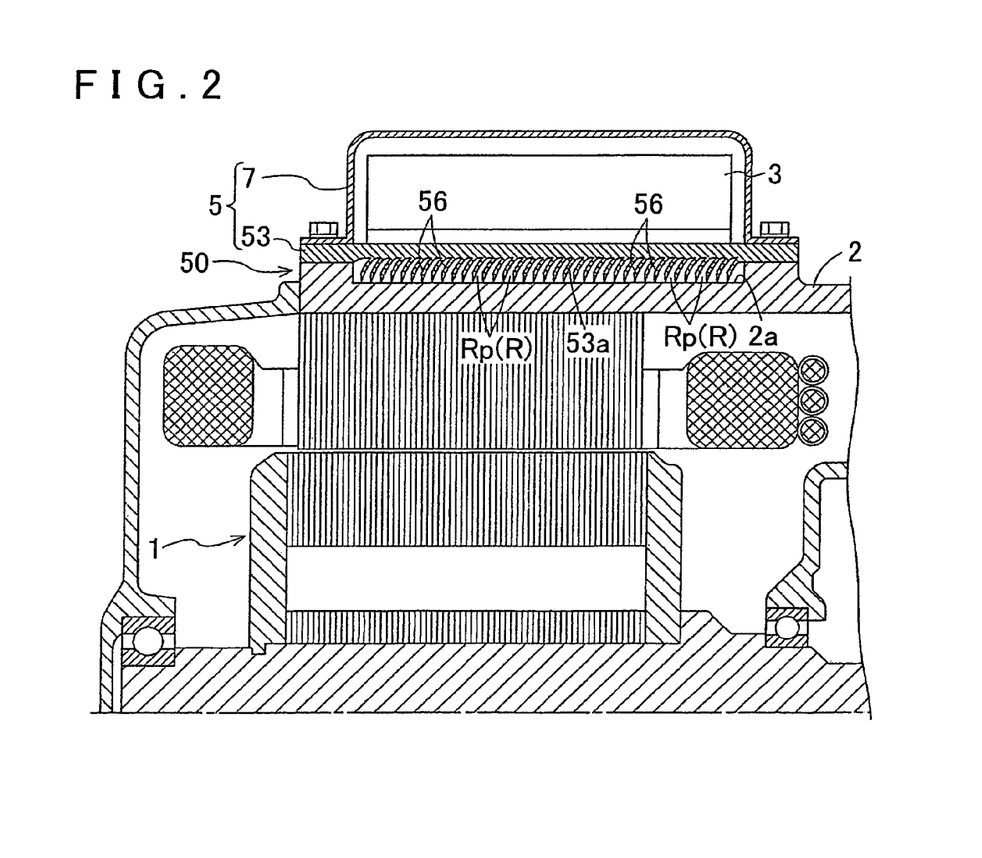
FIG. 2 is a side cross-sectional view of a schematic configuration of a drive unit that includes the heat generating member cooling structure.

As shown in FIG. 2, a drive unit according to the present invention (hereinafter, referred to as "the drive unit") includes an electric motor 1, a drive unit case 2 that houses the electric motor 1 therein, and an inverter 3 that controls the electric motor 1. The drive unit employs a heat generating member cooling structure 50 according to the present invention (hereinafter, referred to as "the cooling structure 50").

The drive unit can serve as a drive unit used in an electric automobile, a hybrid vehicle, or the like. The drive unit case 2 houses therein one or both of a motor and a generator that serve as the electric motor 1 as well as auxiliary mechanisms such as a differential device and a counter gear mechanism.

Figure 1:
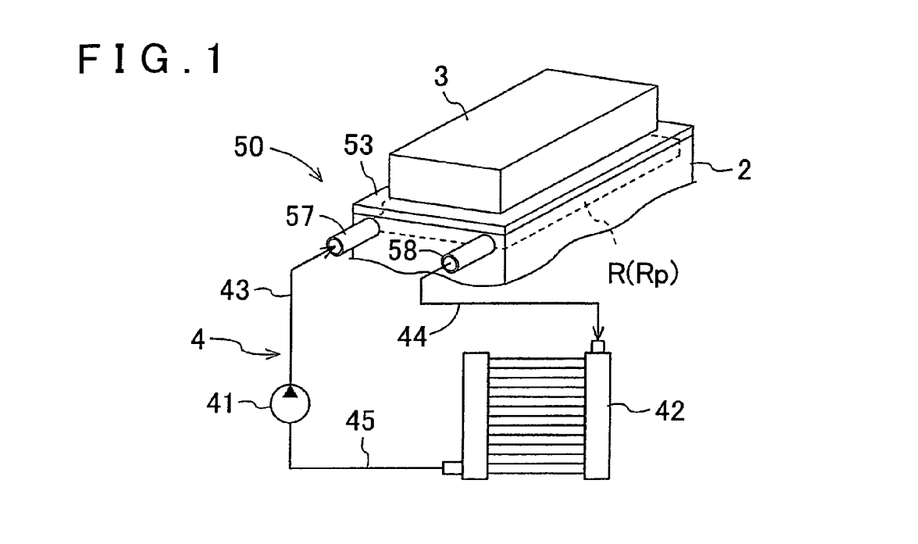
FIG. 1 is a drawing that shows the state of a coolant circulation path in a heat generating member cooling structure.

The detailed configuration of the cooling structure 50 will be explained later. As shown in FIG. 1, the cooling structure 50 is configured so that the heat generated by the heat generating members such as the inverter 3 and the electric motor 1 is released into coolant that circulates in a coolant circulation path 4 to and from a radiator 42 and thereby thermally protects the heat generating members.

The inverter 3 denotes a power module that includes a switching transistor, auxiliary circuit elements, and a circuit substrate that has the switching transistor and the circuit elements provided thereon. By a switching operation, the switching transistor converts a direct current from a battery power source into an alternating current (a three-phase alternating current, if the electric motor is a three-phase alternating-current electric motor).

As shown in FIG. 2, the inverter 3 is disposed on the upper face side of a heat sink 53 that is integrally provided with the substrate of the inverter 3 by being attached to the substrate itself or via another member attached to the substrate. The heat sink 53 is fixed to the bottom portion of an inverter case 7 that houses the inverter 3 therein. The lower face of the heat sink 53 serves as a heat releasing surface 53a that is thermally connected to the inverter 3.

The inverter case 7 is configured to cover and protect the inverter 3 from rain water or dust, while the inverter 3 is housed therein.

The electric motor 1 is housed in the drive unit case 2. The upper face of the drive unit case 2 is positioned opposite the heat releasing surface 53a, and an opposing surface 2a that is thermally connected to the electric motor 1 is formed.

To be more specific, a rectangular recessed portion is formed on the upper face of the drive unit case 2, so that a coolant space R (which is explained later) is formed between the drive unit case 2 and the lower face of the heat sink 53 (i.e., the heat releasing surface 53a) while the heat sink 53 is installed on top of the drive unit case 2. The bottom face of the recessed portion serves as the opposing surface 2a.

In addition, a sealing member (not shown in the drawing) that hermetically seals the coolant space R from the outside thereof is provided, as necessary, between the upper face of the drive unit case 2 and the lower face of the heat sink 53 of the inverter case 5.

In the present application, when it says "the heat releasing surface 53a and the opposing surface 2a are thermally connected to the inverter 3 and the electric motor 1, respectively", it means that the heat generated by the inverter 3 and the electric motor 1 is transferred, either directly or indirectly, to the heat releasing surface 53a and the opposing surface 2a, respectively.

In the cooling structure 50, the coolant space R is formed between the heat releasing surface 53a of the heat sink 53 and the opposing surface 2a of the drive unit case 2, and a plurality of heat releasing fins 56 are provided within the coolant space R such that they are positioned parallel to one another and stand from the heat releasing surface 53a toward the opposing surface 2a, and an inter-fin passage Rp through which the coolant flows is formed between every two of the plurality of heat releasing fins 56 that are positioned adjacent to each other. The coolant that has been supplied to the coolant space R by a coolant pump 41 (see FIG. 1) provided on a coolant circulation path (which is explained later) is arranged so as to flow through the plurality of inter-fin passages Rp that are positioned parallel to one another. As a result, the inverter 3 is cooled down via the heat releasing surface 53a. Also, the electric motor 1 is cooled down via the opposing surface 2a.

Figure 3:
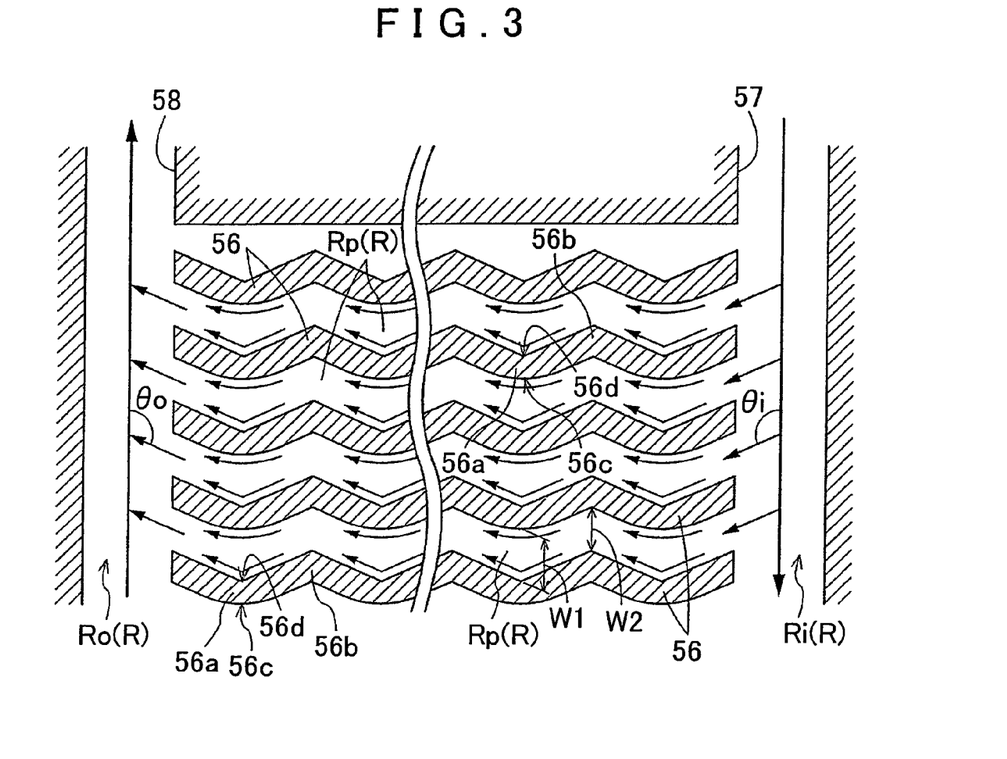
FIG. 3 is a plan view that shows the state of a coolant space.

Further, as shown in FIG. 3, each of the plurality of heat releasing fins 56 that are positioned parallel to one another is formed so as to have a meandering shape that has a plurality of bent portions 56a and 56a along the direction in which the coolant flows.

More specifically, each of the heat releasing fins 56 is formed so as to have a zigzag shape in which the bent portions 56a and the bent portions 56b are arranged so as to alternate, the bent portions 56a being bent in a specific direction and the bent portions 56b being bent in a direction opposite to the direction in which the bent portions 56a are bent.

In this configuration, each of the inter-fin passages Rp formed between every two of the plurality of heat releasing fins 56 that are positioned adjacent to each other is configured so as to have a meandering shape having inflection portions that inflects the flowing direction of the coolant. More specifically, each of the inter-fin passages Rp is formed so as to have a zigzag shape. As a result, it is possible to enlarge the heat transfer area of the heat releasing fins 56, and also to promote turbulence in the flow of the coolant so as to improve the level of heat releasing performance.

Further, the side wall surfaces on both sides of each of the heat releasing fins 56 are formed so as to have mutually different shapes. More specifically, at least one of the plurality of bent portions 56a and the bent portions 56b of the heat releasing fins 56 is arranged so as to be a different shape bent portion 56a that is formed as a result of arranging the side wall surfaces 56c and 56d on both sides of each the heat releasing fins 56 so as to have mutually different bent shapes. Further, the different shape bent portion 56a is obtained by arranging the side wall surface 56c on the convex side so as to have an arc shape, while arranging the side wall surface 56d on the concave side so as to have a cornered shape.

With these arrangements, a passage width W1 in a portion of the inter-fin passages Rp that is interposed between the side wall surfaces 56c and 56d that are shaped mutually differently (i.e., a passage width W1 in an inflection portion that is interposed between a pair of bent portions 56a) is larger than a passage width W2 in other portions of the inter-fin passages Rp. Thus, each of the inter-fin passages Rp has a meandering shape in which the passage width thereof changes and becomes wider at the inflection portions. As a result, when the coolant flows through the inter-fin passages Rp that are configured as described above, for example, the flow rate of the coolant changes at the inflection portions. Consequently, it is possible to further promote turbulence in the flow of the coolant, and to further improve the level of heat releasing performance.

To ensure that there is sufficient area for the heat exchange, each of the plurality of heat releasing fins 56 is arranged to extend into the coolant space R from the heat releasing surface 53a on the heat sink 53 side toward the opposing surface 2a on the drive unit case 2 side, so as to substantially traverse the coolant space R in the thickness direction thereof.

Figure 8:
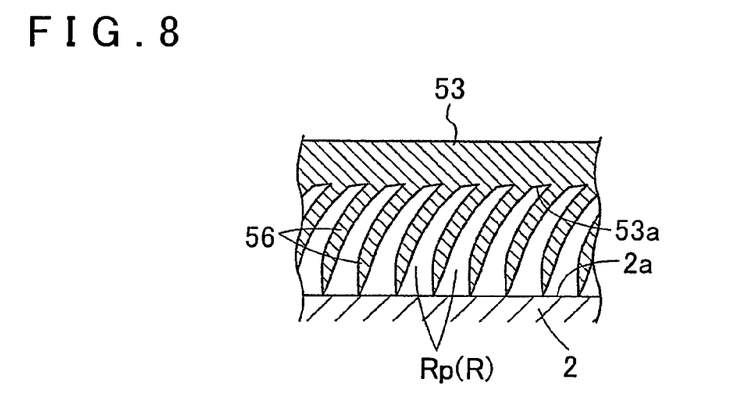
FIG. 8 is a partial side cross-sectional view of heat releasing fins.

Further, as shown in FIG. 8, each of the heat releasing fins 56 is provided to stand from the heat releasing surface 53a toward the opposing surface 2a, while being at an angle and also being curled. With this arrangement, the length of each of the heat releasing fins 56 is arranged to be longer, in the standing direction. As a result, it is possible to enlarge the heat transfer area of the heat releasing fins 56, and also to improve the level of heat releasing performance.

In addition, the edge portion of each of the heat releasing fins 56 is positioned apart from the opposing surface 2a on the drive unit case 2 side so as to have a small distance there between.

It is acceptable to have another arrangement in which a part or all of the edge portions of the heat releasing fins 56 abut against the opposing surface 2a so as to allow a heat transfer between the heat releasing fins 56 and the drive unit case 2. In other words, when the edge portions of the heat releasing fins 56 are arranged so as to abut against the opposing surface 2a, the coolant is prevented from flowing through the plurality of inter-fin passages Rp by coming and going through the edge portion side of the heat releasing fins 56. Thus, it is possible to have the coolant flow in a stable manner, and to make the level of heat releasing performance substantially uniform. Further, it is possible to properly release the heat transferred from the electric motor 1 or the like to the opposing surface 2a, to the coolant side via the heat releasing fins 56.

Further, as shown in FIG. 3, an inflow-side port 57 and an outflow-side port 58 are connected to a lateral end portion on one side of the coolant space R while being positioned parallel to each other. The inflow-side port 57 is configured so as to allow the coolant to flow into the coolant space R, whereas the outflow-side port 58 is configured so as to allow the coolant to flow out of the coolant space R. Further, within the coolant space R, a coolant inflow portion Ri and a coolant outflow portion Ro are provided so as to be positioned parallel to each other. The coolant inflow portion Ri extends from the inflow-side port 57 to the lateral end portion of the coolant space R on the other side. The coolant outflow portion Ro extends from the outflow-side port 58 to the lateral end portion of the coolant space R on the other side. The plurality of inter-fin passages Rp are positioned parallel to one another so as to traverse between the coolant inflow portion Ri and the coolant outflow portion Ro.

An end of each of the heat releasing fins 56 on the coolant inflow side is formed so as to be inflected toward the inflow-side port 57 in such a manner that the angle $\theta i$ formed by the coolant inflow direction from the inflow-side port 57 to the coolant inflow portion Ri and the coolant inflow direction from the coolant inflow portion Ri to the inter-fin passage Rp is obtuse. With this arrangement, the coolant that has flowed into the coolant inflow portion Ri from the inflow-side port 57 smoothly flows into the inter-fin passage Rp. Thus, it is possible to prevent an increase in the pressure loss.

Further, an end of each of the heat releasing fins 56 on the coolant outflow side is formed to be inflected toward the outflow-side port 58 in such a manner that the angle $\theta o$ formed by the coolant outflow direction from the inter-fin passage Rp to the coolant outflow portion Ro and the coolant outflow direction from the coolant outflow portion Ro to the outflow-side port 58 is obtuse. With this arrangement, the coolant that has flowed out of the inter-fin passage Rp into the coolant outflow portion Ro smoothly flows out of the coolant space R through the outflow-side port 58. Thus, in a similar manner as described above, it is possible to prevent an increase in the pressure loss.

It is desirable to arrange the angles $\theta i$ and $\theta o$ so as to be as close as possible to 180 degrees. However, it is possible to determine the angles $\theta i$ and $\theta o$, as necessary, depending on the positional arrangements of the inflow-side port 57 and the outflow-side port 58 with respect to the coolant inflow portion Ri and the coolant outflow portion Ro.

Figure 4:
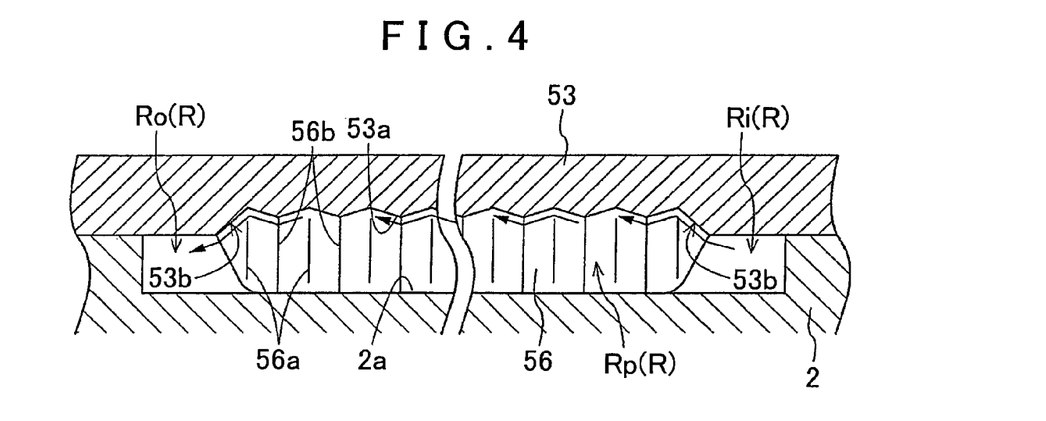
FIG. 4 is a vertical sectional view that shows the state of the coolant space.

Further, as shown in FIG. 4, the heat releasing surface 53a in the inter-fin passages Rp has concave portions and convex portions formed thereon along the direction in which the coolant flows. More specifically, the heat releasing surface 53a in the inter-fin passages Rp has formed thereon the concave portions and the convex portions that are arranged so as to alternate. Each of the concave portions is formed near a corresponding one of the different shape bent portions 56a of the heat releasing fins 56. Each of the convex portions is formed near a corresponding one of the other bent portions 56b of the heat releasing fins 56. Because the coolant flows through the inter-fin passages Rp along the concave portions and the convex portions that are formed on the heat releasing surface 53a, it is possible to further promote turbulence in the flow of the coolant, and also to further improve the level of heat releasing performance.

Figure 5:
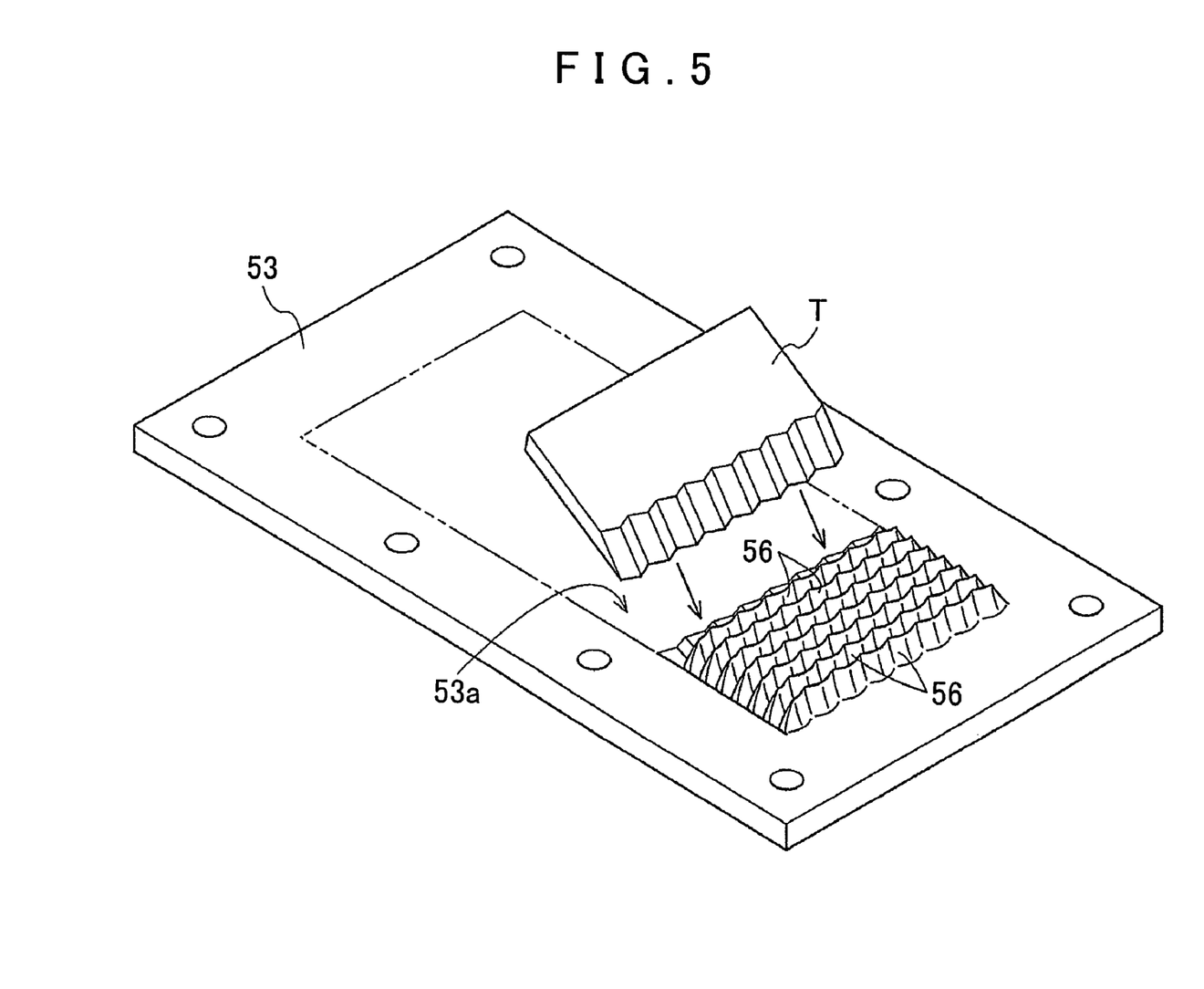
FIG. 5 is a perspective view that shows how to form heat releasing fins.

As shown in FIG. 5, it is possible to form the plurality of heat releasing fins 56 as described above to stand from the heat releasing surface 53a by cutting and raising the heat releasing surface 53a of the heat sink 53 that is made of a material that has high heat conductivity such as aluminum, an aluminum alloy, a copper alloy, stainless steel, or the like, with the use of a cutting tool T that has a special shape.

To be more specific, the cutting tool T is prepared so that the edge thereof is formed with a row of convex shapes so as to fit the shape of the side wall surface 56d that has a cornered shape. With the use of the cutting tool T prepared as above, it is possible to form the plurality of heat releasing fins 56 that are positioned parallel to one another by cutting and raising, a number of times in succession, the heat releasing surface 53a such that there is a small distance between the heat releasing fins.

By determining various conditions appropriately such as how deep and at what angle the heat releasing surface 53a is cut by the cutting tool T, in the bent portions 56a of the heat releasing fins 56 that are formed by the apexes of the row of convex shapes on the edge of the cutting tool T, it is possible to form the side wall surface 56d on the side that abuts against the cutting tool T so as to have a cornered shape, and to form the side wall surface 56c on the opposite side so as to have an arc shape due to a tensile stress or the like.

Because the heat releasing surface 53a is cut and raised by using the cutting tool T, when the heat releasing fins 56 are formed to stand from the heat releasing surface 53a, the shape of the edge portion of each of the heat releasing fins 56 is wavy due to variations in the cutting angle and the cutting depth. When the heat releasing fins 56 that have wavy edge portions are used as they are, it is possible to position the edge portions of the heat releasing fins 56 in such a manner that some parts abut against the opposing surface 2a on the drive unit case 2 side, while other parts are apart from the opposing surface 2a with a small distance there between.

In addition, when the heat releasing surface 53a is cut while the cutting tool T makes a relative movement at an angle, each of the heat releasing fins 56 is formed to have concave portions and convex portions on the heat releasing surface 53a side, like the edge of the cutting tool T where the apexes of the row of convex shapes are the deepest. As a result, in each of inter-fin passages Rp that are formed by every two of the plurality of heat releasing fins 56 that are positioned adjacent to each other, the heat releasing surface 53a has the concave portions and the convex portions (see FIG. 4).

When the heat releasing fins 56 are formed to stand, as explained above, by cutting and raising the heat releasing surface 53a of the heat sink 53 with the use of the cutting tool T, the heat releasing surface 53a in the inter-fin passages Rp is formed to have a concave shape with respect to the coolant inflow portion Ri and the coolant outflow portion Ro as shown in FIG. 4. The level difference between the heat releasing surface 53a and the coolant inflow portion Ri in the inter-fin passages Rp and the level difference between the heat releasing surface 53a and the coolant outflow portion Ro in the inter-fin passages Rp are each connected by an inclined surface 53b. With this arrangement, it is possible to allow the coolant to smoothly flow into the inter-fin passages Rp from the coolant inflow portion Ri and flow out of the inter-fin passages Rp into the coolant outflow portion Ro. Consequently, it is possible to prevent an increase in the pressure loss.

Next, the coolant circulation path 4 to which the coolant space R is connected will be explained further in detail, with reference to FIG. 1.

The coolant circulation path 4 is used for having one type of coolant circulate via the coolant space R that is provided between the heat sink 53 and the drive unit case 2. The coolant circulation path 4 is made up of the coolant pump 41 that serve as a pump pressure source, a radiator 42 that serves as a heat exchanger, and flow paths 43, 44, and 45 that connect these elements to one another.

As explained above, the cooling structure 50 has a high level of heat releasing performance and is able to prevent an increase in the pressure loss of the coolant. As a result, it is possible to make the coolant pump 41 compact and also to make the driving power for the coolant pump 41 smaller, thereby achieving energy-saving.

The auxiliary equipment for the coolant pump 41 such as a driving motor is omitted from the drawing. The outlet side flow path 43 of the coolant pump 41 that serves as a starting point of the coolant circulation path 4 is connected to the inflow-side port 57 on the entrance side of the coolant space R. The outflow-side port 58 on the exit side of the coolant space R is connected to the entrance side of the radiator 42 via the return flow path 44. The exit side of the radiator 42 is connected to the inlet side flow path 45 of the coolant pump 41. Thus, in the coolant circulation path 4, the coolant such as cooling water is pumped out by the coolant pump 41, and then is heated while flowing through the inter-fin passages Rp formed within the coolant space R and absorbing the heat from the module included in the inverter 3 and the heat from the drive unit case 2. After that, the coolant is put into the radiator 42 via the return flow path 44 and is cooled down when the heat is released into the air. Subsequently, the coolant is returned to the coolant pump 41, thereby completing one cycle of circulation. The coolant repeats this circulation.

It is acceptable to have another arrangement in which, for example, a section of the coolant circulation path 4 corresponding to the return flow path 44 serves a flow path that goes through the drive unit case 2 in order to further provide a cooling function.

OTHER EMBODIMENTS (1) In the embodiment described above, each of the heat releasing fins 56 is formed so as to have a zigzag shape in which the bent portions 56a that are bent in a specific direction and the bent portions 56b that are bent in a direction opposite to the direction in which the bent portions 56a are bent are arranged to alternate. Accordingly, each of the inter-fin passages Rp that are formed between every two of the plurality of the heat releasing fins 56 that are positioned adjacent to each other has also a zigzag shape. However, it is acceptable to configure the heat releasing fins 56 and the inter-fin passages Rp so as to have any other meandering shape that is different from the zigzag shape.

Figure 6:
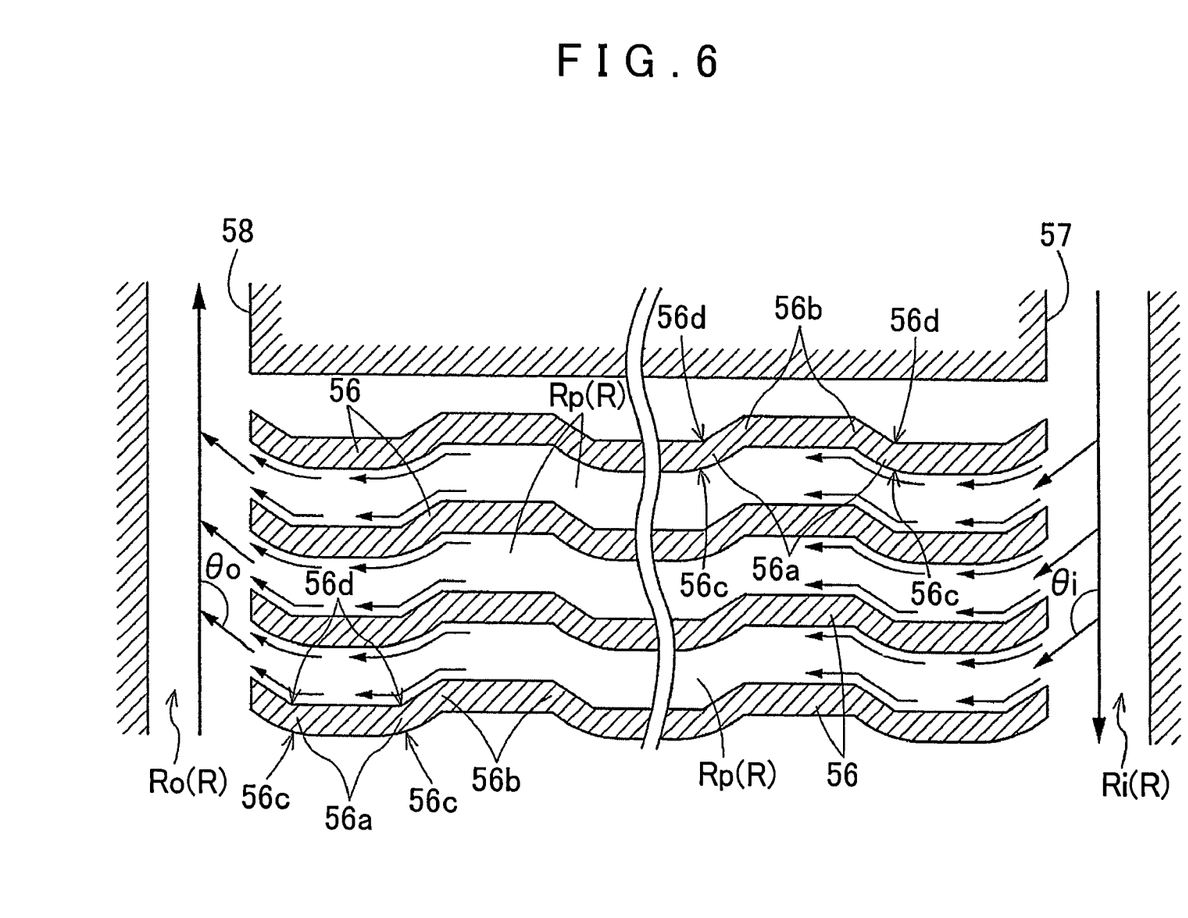
FIG. 6 is a plan view that shows the state of a coolant space according to another embodiment.

For example, as shown in FIG. 6, it is acceptable to configure each of the heat releasing fins 56 so as to have a meandering shape in which a pair of bent portions 56a that are bent in specific directions and a pair of bent portions 56b that are bent in directions opposite to the directions in which the pair of bent portions 56a are bent are arranged to alternate.

In this case also, at least one of the plurality of bent portions 56a and the bent portions 56b of the heat releasing fins 56 is arranged so as to be a different shape bent portion 56a that is formed as a result of arranging the side wall surfaces 56c and 56d on both sides of each of the heat releasing fins 56 so as to have mutually different bent shapes. Further, the different shape bent portion 56a is obtained by arranging the side wall surface 56c on the convex side so as to have an arc shape, while arranging the side wall surface 56d on the concave side so as to have a cornered shape.

Figure 7:
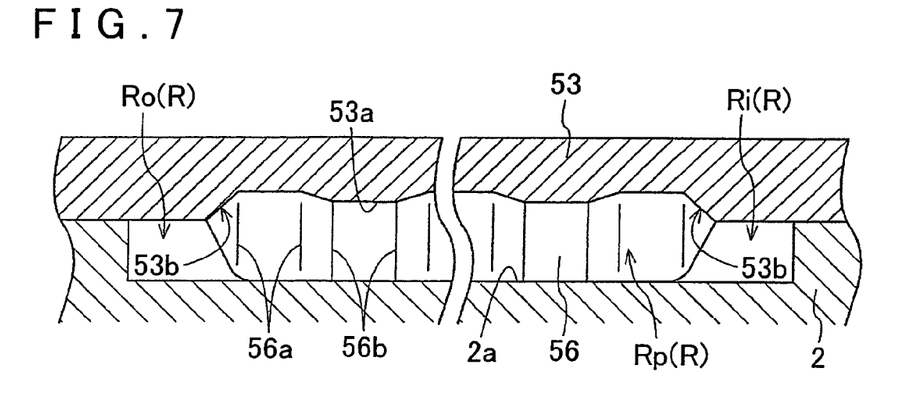
FIG. 7 is a vertical sectional view that shows the state of a coolant space according to yet another embodiment.

In the case where an inter-fin passage Rp is formed between every two of the plurality of heat releasing fins 56 shaped as described above that are positioned adjacent to each other, it is also possible to improve the level of heat releasing performance by configuring the heat releasing surface 53a in the inter-fin passages Rp so as to have concave portions and convex portions along the direction in which the coolant flows, as shown in FIG. 7. Further, it is possible to apply the arrangement in which the level difference between the heat releasing surface 53a and the coolant inflow portion Ri in the inter-fin passages Rp and the level difference between the heat releasing surface 53a and the coolant outflow portion Ro in the inter-fin passages Rp are each connected by the inclined surface 53b so as to prevent an increase in the pressure loss.

Figure 9:
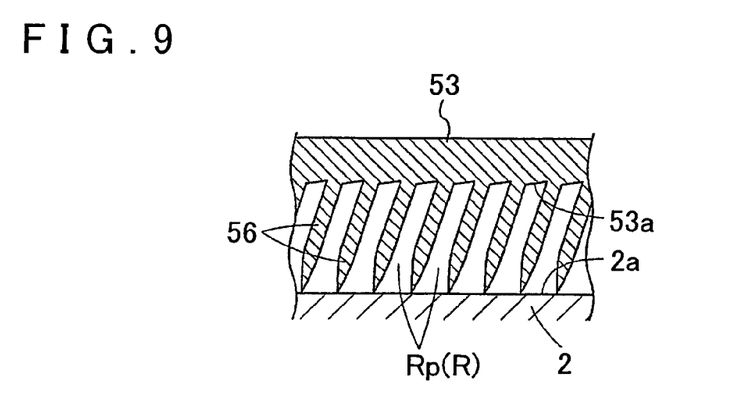
FIG. 9 is a partial side cross-sectional view of heat releasing fins according to another embodiment.
Figure 10:
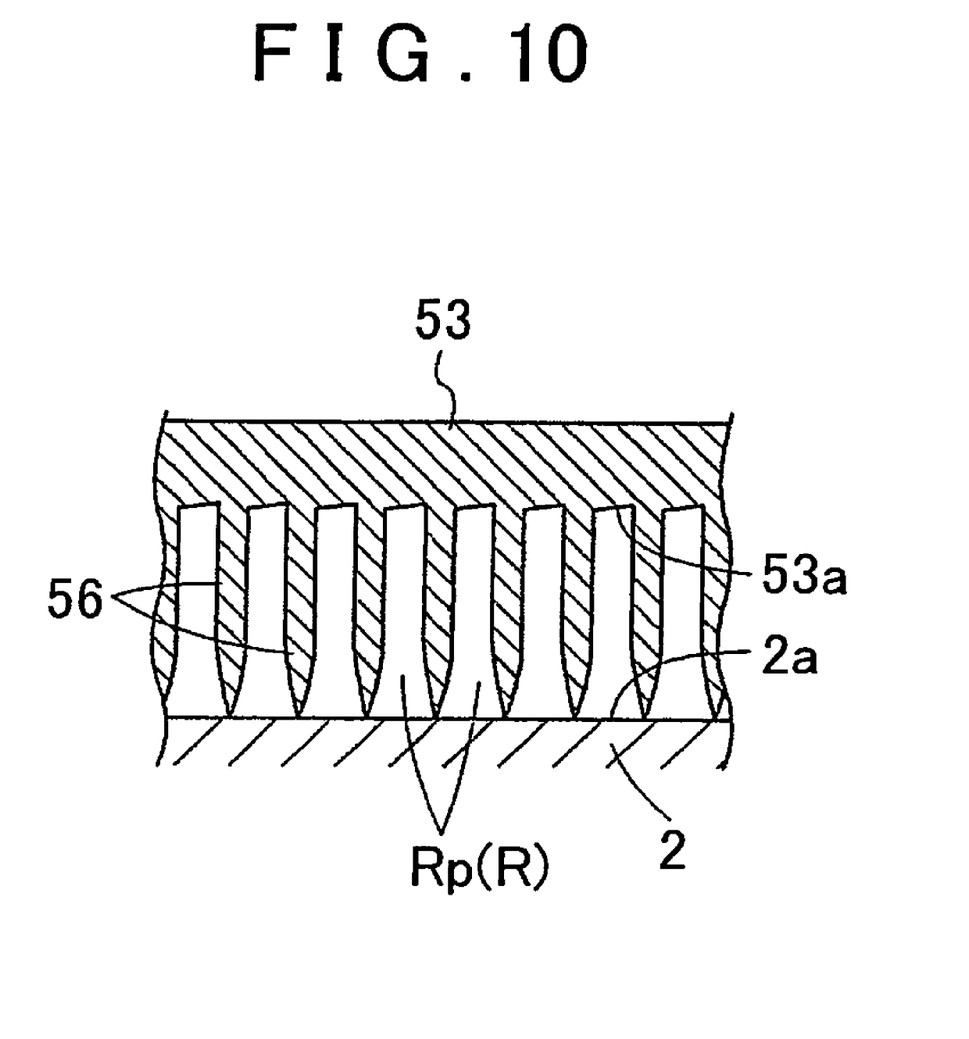
FIG. 10 is a partial side cross-sectional view of heat releasing fins according to yet another embodiment.

(2) In the description of the embodiment above, each of the heat releasing fins 56 is provided to stand from the heat releasing surface 53a toward the opposing surface 2a, while being at an angle and also being curled, as shown in FIG. 8. However, it is acceptable to have another arrangement, as shown in FIG. 9, in which each of the heat releasing fins 56 is provided to stand from the heat releasing surface 53a toward the opposing surface 2a, while being at an angle and straight. Alternatively, it is acceptable to have yet another arrangement, as shown in FIG. 10, in which each of the heat releasing fins 56 is provided to stand perpendicularly from the heat releasing surface 53a toward the opposing surface 2a.

(3) In the embodiment described above, at least one of the bent portions of the heat releasing fins 56 is arranged to be the different shape bent portion 56a, so that the side wall surfaces on both sides of each of the heat releasing fins 56 are arranged to have the mutually different shapes. However, it is acceptable to have another arrangement in which all of the bent portions of the heat releasing fins are arranged to be the different shape bent portions. Alternatively, it is acceptable to have yet another arrangement in which, in a portion that is other than the bent portions of the heat releasing fins, the side wall surfaces on both sides are arranged to have mutually different shapes.

(4) In the embodiment described above, the heat releasing fins 56 are formed to stand from the heat releasing surface 53 by cutting and raising the heat releasing surface 53a of the heat sink 53 with the use of the cutting tool T. However, it is acceptable to form the heat releasing fins by using other methods. For example, it is acceptable to weld heat releasing fins that have been manufactured separately onto the heat releasing surface. Alternatively, it is also acceptable to integrally form the heat releasing fins together with the heat sink by using a mold (5) In the description of the embodiment above, the cooling structure 50 is configured so as to thermally protect the heat generating members by releasing, into the coolant, the heat generated by the heat generating members such as the inverter 3 and the electric motor 1 that are included in the drive unit. However, it is acceptable to have another arrangement in which the cooling structure 50 is configured so that the heat that has been generated by an inverter or other electronic parts included in another device is released into the coolant.

The heat generating member cooling structure and the drive unit according to the present invention can be used effectively as a heat generating member cooling structure that has a high level of heat releasing performance and a drive unit that includes such a heat generating member cooling structure and is therefore able to be compact and achieve energy-saving.

In the heat generating member cooling structure according to a first aspect of the present invention, because each of the heat releasing fins is formed so as to have a meandering shape that has the plurality of bent portions along the direction in which the coolant flows, it is possible to form meandering-shaped inter-fin passage having inflection portions that inflect the flowing direction of the coolant, between every two of the plurality of heat releasing fins that are positioned adjacent to each other. As a result, it is possible to enlarge the heat transfer area of the heat releasing fins. It is also possible to improve the level of heat releasing performance because the flowing direction of the coolant is inflected at the inflection portions of the inter-fin passages so that turbulence is promoted in the flow.

Further, in the case where the coolant flows through the meandering-shaped inter-fin passages having the inflection portions, by having the arrangement in which the side wall surfaces on both sides of each of the heat releasing fins are formed so as to have mutually different shapes, it is possible to configure the passage width of the inter-fin passage in the direction in which the plurality of heat releasing fins are positioned parallel to one another so as to vary in the flowing direction of the coolant, by having an arrangement in which the passage width of the portion interposed between two side wall surfaces that have the mutually different shapes is different from the passage width of other portions. As a result, because the coolant flows through the inter-fin passages of which the passage width varies, it is possible to further promote turbulence in the flow of the coolant and to further improve the level of heat releasing performance.

Consequently, the present invention is able to realize a heat generating member cooling structure that has a high level of heat releasing performance.

In the heat generating member cooling structure according to a second aspect of the present invention, because the bent portion of the heat releasing fin is arranged so as to be the different shape bent portion, it is possible to configure the passage width of the inter-fin passage so as to vary in the flowing direction of the coolant, by having the arrangement in which the passage width of the inflection portion is different from the passage width of the other portions. As a result, because the coolant flows through the meandering-shaped inter-fin passages of which the passage width changes in the inflection portion, it is possible to make extremely strong turbulence in the flow of the coolant and also to realize an extremely high level of cooling performance due to a synergistic effect generated by the inflection in the flowing direction of the coolant and the changes in the passage width.

In the heat generating member cooling structure according to a third aspect of the present invention, because each of the heat releasing fins is provided standing so as to protrude at an angle with respect to the opposing surface, it is possible to make the length of each of the heat releasing fins longer in terms of the protruding direction. Thus, it is possible to enlarge the heat transfer area of the heat releasing fins and to further improve the level of heat releasing performance.

In the heat generating member cooling structure according to a fourth aspect of the present invention, because the edge portion of each of the heat releasing fins abuts against the opposing surface, the coolant flowing through one of the inter-fin passages is prevented from flowing into another adjacent inter-fin passage through the edge portion side of the heat releasing fin. Thus, it is possible to have the coolant flow through each of the plurality of inter-fin passages in a stable manner. As a result, it is possible to ensure that the levels of heat releasing performance in the plurality of inter-fin passages are substantially uniform. Further, because the edge portion of each of the heat releasing fins abuts against the opposing surface, it is possible to properly release the heat transferred to the opposing surface to the coolant side via the heat releasing fins.

In the heat generating member cooling structure according to a fifth aspect of the present invention, because the heat releasing surface has the concave portion and the convex portion formed thereon, it is possible to enlarge the heat transfer area of the heat releasing surface and to further improve the level of heat releasing performance.

Further, because the coolant flows through the inter-fin passages along the concave portion and the convex portion formed on the heat releasing surface, it is possible to further promote turbulence in the flow of the coolant and to further improve the level of heat releasing performance.

It is possible to arrange the heat releasing surface so as to have the concave portion and the convex portion as described above, in addition to the formation of the heat releasing fins. In the case where the heat releasing fins are formed to stand from the heat releasing surface, by cutting and raising the heat releasing surface with the use of a cutting tool, it is possible to form the concave and convex portions and the heat releasing fins at the same time, by devising the shape of the cutting tool in the portion that abuts against the heat releasing surface.

In the heat generating member cooling structure according to a sixth aspect of the present invention, it is possible to cause the coolant that has flowed into the coolant space to flow into the inter-fin passages only by inflecting the inflow direction so as to be at the obtuse angle. Also, it is possible to cause the coolant that has flowed out of the inter-fin passages to flow out of the coolant space only by inflecting the outflow direction so as to be at the obtuse angle. Thus, it is possible to have the coolant smoothly flow into and out of the coolant space and the inter-fin passages. As a result, it is possible to prevent an increase in the pressure loss. Consequently, it is possible to configure the coolant pump used for supplying the coolant into the coolant space so as to be compact and energy-saving.

In the heat generating member cooling structure according to a seventh aspect of the present invention, because the heat releasing surface in the inter-fin passages is formed so as to have a concave portion, it is possible to position the heat releasing surface closer to the heat generating member side. Thus, it is possible to ensure that the heat generated by the heat generating member is properly transferred to the heat releasing surface. Further, because the level difference between the heat releasing surface and the coolant inflow portion in the inter-fin passages and the level difference between the heat releasing surface and the coolant outflow portion in the inter-fin passages are each connected by the inclined surface that is either flat or curved, it is possible to ensure that the coolant smoothly flows into and out of the inter-fin passages. It is therefore possible to prevent an increase in the pressure loss. Consequently, it is possible to configure the coolant pump used for supplying the coolant into the coolant space so as to be compact and energy-saving.

In addition, when the heat releasing fins are formed to stand from the heat releasing surface, by cutting and raising the heat releasing surface with the use of a cutting tool, it is possible to form the inclined surface and the heat releasing fins at the same time, by devising the shape of the cutting tool in the portion that abuts against the heat releasing surface.

With the drive unit according to an eighth aspect of the present invention, when the drive unit that has the electric motor built therein is integrally formed with the inverter, the heat generating member cooling structure according to the present invention described above is included in the drive unit, while the inverter is used as the heat generating member. Thus, it is possible to achieve the same characteristic configuration as the characteristic configuration of the heat generating member cooling structure. Consequently, it is possible to properly release the heat from the inverter and to thermally protect the inverter.

With the drive unit according to a ninth aspect of the present invention, because the drive unit case is thermally connected to the heat releasing surface, it is possible to properly release the heat generated by the electric motor and the like within the drive unit case, to the coolant side via the heat releasing surface.

In addition, when the drive unit case is thermally connected to the heat releasing surface as described above, by having the edge portion of each of the heat releasing fins abut against the opposing surface, it is possible to improve the level of heat releasing performance from the heat releasing surface to the coolant side.

What is claimed is:

1. A heat generating member cooling structure in which a coolant space is formed between a heat releasing surface that is thermally connected to a heat generating member and an opposing surface that is positioned opposite the heat releasing surface, comprising:
   a plurality of heat releasing fins that are provided within the coolant space so as to be parallel to one another and stand from the heat releasing surface toward the opposing surface, and
   an inter-fin passage, through which a coolant flows, formed between every two of the plurality of heat releasing fins that are positioned adjacent to each other, wherein:
      each of the heat releasing fins is formed so as to have a meandering shape having a plurality of bent portions along a direction in which the coolant flows that inflect a flowing direction of the coolant, and
      side wall surfaces on both sides of each of the heat releasing fins are formed so as to have mutually different shapes, and side wall surfaces on both sides of each of the inter-fin passages are shaped mutually differently.

2. The heat generating member cooling structure according to claim 1, wherein:
   at least one of the plurality of bent portions is arranged so as to be a different shape bent portion that is formed as a result of arranging the side wall surfaces on both sides of each of the heat releasing fins so as to have the mutually different bent shapes, and
   the different shape bent portion is obtained by arranging a side wall surface on a first side so as to have an arc shape, while arranging a side wall surface on a second side so as to have a cornered shape, and an inflection portion of the inter-fin passages is interposed between a pair of the different shape bent portions.

3. The heat generating member cooling structure according to claim 2, wherein each of the heat releasing fins stands from the heat releasing surface toward the opposing surface while being at an angle.

4. The heat generating member cooling structure according to claim 3, wherein an edge portion of each of the heat releasing fins abuts against the opposing surface.

5. The heat generating member cooling structure according to claim 2, wherein the heat releasing surface in the inter-fin passages has a concave portion and a convex portion formed thereon along the direction in which the coolant flows.

6. The heat generating member cooling structure according to claim 5, wherein:
- an end of each of the heat releasing fins on a coolant inflow side is configured such that an angle formed by a direction in which the coolant flows into the coolant space and a direction in which the coolant flows into the inter-fin passage is obtuse, and
- an end of each of the heat releasing fins on a coolant outflow side is configured such that an angle formed by a direction in which the coolant flows out of the inter-fin passage and a direction in which the coolant flows out of the coolant space is obtuse.

7. The heat generating member cooling structure according to claim 5, wherein:
- the heat releasing surface in the inter-fin passages is formed so as to have a concave shape, and
- a level difference between the heat releasing surface and a coolant inflow portion in the inter-fin passages and a level difference between the heat releasing surface and a coolant outflow portion in the inter-fin passages are each connected by an inclined surface.

8. The heat generating member cooling structure according to claim 2, wherein:
- an end of each of the heat releasing fins on a coolant inflow side is configured such that an angle formed by a direction in which the coolant flows into the coolant space and a direction in which the coolant flows into the inter-fin passage is obtuse, and
- an end of each of the heat releasing fins on a coolant outflow side is configured such that an angle formed by a direction in which the coolant flows out of the inter-fin passage and a direction in which the coolant flows out of the coolant space is obtuse.

9. The heat generating member cooling structure according to claim 2, wherein:
- the heat releasing surface in the inter-fin passages is formed so as to have a concave shape, and
- a level difference between the heat releasing surface and a coolant inflow portion in the inter-fin passages and a level difference between the heat releasing surface and a coolant outflow portion in the inter-fin passages are each connected by an inclined surface.

10. The heat generating member cooling structure according to claim 1, wherein the heat releasing surface in the inter-fin passages has a concave portion and a convex portion formed thereon along the direction in which the coolant flows.

11. The heat generating member cooling structure according to claim 10, wherein:
- an end of each of the heat releasing fins on a coolant inflow side is configured such that an angle formed by a direction in which the coolant flows into the coolant space and a direction in which the coolant flows into the inter-fin passage is obtuse, and
- an end of each of the heat releasing fins on a coolant outflow side is configured such that an angle formed by a direction in which the coolant flows out of the inter-fin passage and a direction in which the coolant flows out of the coolant space is obtuse.

12. The heat generating member cooling structure according to claim 10, wherein:
- the heat releasing surface in the inter-fin passages is formed so as to have a concave shape, and
- a level difference between the heat releasing surface and a coolant inflow portion in the inter-fin passages and a level difference between the heat releasing surface and a coolant outflow portion in the inter-fin passages are each connected by an inclined surface.

13. The heat generating member cooling structure according to claim 1, wherein:
- an end of each of the heat releasing fins on a coolant inflow side is configured such that an angle formed by a direction in which the coolant flows into the coolant space and a direction in which the coolant flows into the inter-fin passage is obtuse, and
- an end of each of the heat releasing fins on a coolant outflow side is configured such that an angle formed by a direction in which the coolant flows out of the inter-fin passage and a direction in which the coolant flows out of the coolant space is obtuse.

14. The heat generating member cooling structure according to claim 13, wherein:
- the heat releasing surface in the inter-fin passages is formed so as to have a concave shape, and
- a level difference between the heat releasing surface and a coolant inflow portion in the inter-fin passages and a level difference between the heat releasing surface and a coolant outflow portion in the inter-fin passages are each connected by an inclined surface.

15. The heat generating member cooling structure according to claim 1, wherein a passage width in a portion of the inter-fin passages that is interposed between the side wall surfaces that have mutually different shapes is larger than a passage width in other portions of the inter-fin passages.

16. The heat generating member cooling structure according to claim 5, wherein each of the concave portions of the heat releasing surface is formed near a corresponding bent portion of the heat releasing fins.

17. The heat generating member cooling structure according to claim 10, wherein each of the concave portions of the heat releasing surface is formed near a corresponding bent portion of the heat releasing fins.

18. A drive unit comprising:
- an electric motor;
- a drive unit case that houses the electric motor therein;
- an inverter that controls the electric motor; and
- the heat generating member cooling structure according to 1, wherein the inverter is the heat generating member.

19. The drive unit according to claim 18, wherein
- the drive unit case is positioned on the opposing surface side with respect to the heat releasing surface, and
- the drive unit case is thermally connected to the opposing surface.

* * * * *